(12) United States Patent
Lee

(10) Patent No.: US 7,880,093 B2
(45) Date of Patent: Feb. 1, 2011

(54) 3-DIMENSIONAL SUBSTRATE FOR EMBODYING MULTI-PACKAGES AND METHOD OF FABRICATING THE SAME

(75) Inventor: Woong Sun Lee, Suwon-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 827 days.

(21) Appl. No.: 11/693,107

(22) Filed: Mar. 29, 2007

(65) Prior Publication Data

US 2008/0081209 A1    Apr. 3, 2008

(30) Foreign Application Priority Data

Sep. 28, 2006    (KR)    ........................ 10-2006-0095099

(51) Int. Cl.
  *H05K 1/03*    (2006.01)
(52) U.S. Cl. .................. 174/256; 174/257; 174/258
(58) Field of Classification Search .............. 174/256, 174/257, 258; 428/620
  See application file for complete search history.

(56) References Cited

U.S. PATENT DOCUMENTS

| | | | | |
|---|---|---|---|---|
| 4,759,970 A | * | 7/1988 | Seeger et al. ................ | 428/209 |
| 5,258,577 A | * | 11/1993 | Clements ................... | 174/88 R |
| 6,002,180 A | * | 12/1999 | Akram et al. ................ | 257/783 |
| 6,005,289 A | * | 12/1999 | Watanabe et al. ........... | 257/700 |
| 6,255,138 B1 | * | 7/2001 | Haishima ..................... | 438/119 |
| 6,515,233 B1 | * | 2/2003 | Labzentis et al. ............ | 174/254 |
| 2003/0102151 A1 | * | 6/2003 | Hirose et al. ................. | 174/250 |
| 2004/0221448 A1 | * | 11/2004 | Naito et al. ................... | 29/830 |
| 2005/0173708 A1 | * | 8/2005 | Suehiro et al. ................ | 257/79 |

FOREIGN PATENT DOCUMENTS

| | | |
|---|---|---|
| JP | 2000-151107 A | 5/2000 |
| JP | 2000-196237 A | 7/2000 |
| JP | 2005-129608 A | 5/2005 |

\* cited by examiner

*Primary Examiner*—Hung S Bui
*Assistant Examiner*—Steven Sawyer
(74) *Attorney, Agent, or Firm*—Ladas & Parry LLP

(57) ABSTRACT

A substrate for embodying multi-package comprises an underlying layer has a polymer material containing a conductive filler and provided with a step-like groove divided into step part and bottom part; a coating layer formed over the underlying layer, the coating layer is formed so that it may define a metal-wire forming area on the step part and the bottom part of the step-like groove and the conductive filler in the metal-wire forming area is exposed; and a metal wire formed via a plating process using the exposed conductive filler in the metal-wire forming area defined by the coating layer as a seed layer.

25 Claims, 3 Drawing Sheets

3-DIMENSIONAL SUBSTRATE FOR EMBODYING MULTI-PACKAGES AND METHOD OF FABRICATING THE SAME

CROSS-REFERENCE TO RELATED APPLICATIONS

The present application claims priority to Korean patent application number 10-2006-0095099 filed on Sep. 28, 2006, which is incorporated by reference in its entirety.

BACKGROUND OF THE INVENTION

The present invention relates to a substrate and a method of fabricating the same, and more particularly to a 3-dimensional substrate for embodying multi-packages and a method of fabricating the same.

In terms of the semiconductor industry, the semiconductor packaging technology has been continually developing in response to smaller-size requirements and mounting reliability. Consequently, the packaging technology has been developed to make the size of the package approach the size of the chip and to improve the efficiency of mounting works and mechanical and electrical reliability upon mounting.

Further, as the miniaturization as well as high performance of electric and electronic products are requested, various technologies are discovered and developed to provide a semiconductor module of high capacity. One method for providing such a semiconductor module of high capacity is to increase the semiconductor chip capacity, i.e., high integration of the semiconductor chip to cause a larger number of cells to be integrated within a defined space of the semiconductor chip.

However, precise fine line-width is needed for high integration of the semiconductor chip, resulting in the need for complex technologies, which often require long research and development times. Therefore, the technology of multi-package packaging is proposed as another method for providing a semiconductor module of high capacity.

The multi-package refers to two or more semiconductor chips or semiconductor packages that are fabricated as a single package. Typically, the multi-package is fabricated by arranging several semiconductor chips or semiconductor packages in a printed circuit board or stacking two or more semiconductor chips or semiconductor packages in a laminate structure.

Generally, the printed circuit board used in the multi-package is made by forming conductive pattern on the surface or surface and inside of the electrical insulating substrate. Such a printed circuit substrate has been fabricated only in a flat type by means of a process such as a press process, which is preferable to simple mounting structure and has lower costs.

Therefore, when embodying the multi-package using the prior printed circuit surface of the flat type, additional means, such as bonding wire, solder balls, and conductive pins, are needed for electrical connection between semiconductor chips or laminated semiconductor packages.

Consequently, the package structure is becoming increasingly complex and requiring processes of a higher cost.

SUMMARY OF THE INVENTION

An embodiment of the present invention is directed to a three-dimensional substrate for embodying a multi-package and a method of fabricating the same.

According to one embodiment of the present invention, the substrate for embodying a multi-package comprises: an underlying layer consisting essentially of a polymer material containing a conductive filler and provided with a step-like groove divided into a step part and bottom part; a coating layer formed over the underlying layer such that it defines a metal-wire forming area on the step part and the bottom part of the step-like groove and the conductive filler in the metal-wire forming area is exposed; and a metal wire formed via a plating process using the exposed conductive filler in the metal-wire forming area defined by the coating layer as a seed layer.

The conductive filler is metal material having a diameter of 1~10 μm.

The metal material is any one of Ni, Cu, Au, Ag and Al.

The conductive filler comprises polymer material having a diameter of 1~10 μm of which surface is plated with the metal material.

The metal material is any one of Ni, Cu, Au, Ag and Al.

The conductive filler has a volume rate of 5~30% to the total volume of the underlying layer.

The polymer material is any one of polypropylene, epoxy and polyethylene.

The metal wire comprises Cu or Au.

The metal wire has a height less than that of the coating layer.

The coating layer comprises a solder resist.

The step-like groove has at least one step part.

The metal wire is formed so that one end and the other end thereof are disposed on the step part and the bottom part respectively.

According to another embodiment, a method of fabricating a substrate for embodying a multi-package comprises: forming an underlying layer consisting essentially of a polymer material containing a conductive filler and provided with a step-like groove divided into the step part and the bottom part; forming a coating layer over the underlying layer; exposing the conductive filler in the metal-wire forming area by patterning the coating layer so that the metal-wire forming area is defined on the step part and the bottom part of the underlying layer; and forming a metal wire via a plating process using the exposed conductive filler in the metal-wire forming area as a seed layer.

The conductive filler is used with a metal material having a diameter of 1~10 μm or polymer material having a diameter of 1~10 μm in which the surface is plated with the metal material.

The metal material is any one of Ni, Cu, Au, Ag and Al.

The conductive filler is contained at a volume rate of 5~30% to a total volume of the underlying layer.

The polymer material is used with any one of polypropylene, epoxy and polyethylene.

The underlying layer is formed via any one of a press process, pultrusion process, sheet molding compound process and injection molding process.

The coating layer is formed by a solder resist.

The coating layer is patterned via an optical method using a laser or thermal method using thermal wire.

The metal wire has a height of less than that of the coating layer.

The metal wire is formed via an electroless plating process using an electroless plating solution in a temperature range of 80~85° C. containing Cu or Au.

The time consumed in the electroless plating process is inversely proportional to the density of Cu or Au contained in the electroless plating solution.

The method further comprises cleaning the underlying layer formed with the metal wire after forming the metal wire.

The metal wire is formed so that one end and the other end thereof are disposed on the step part and the bottom part respectively.

DESCRIPTION OF A SPECIFIC EMBODIMENTS

The present invention provides the substrate which is enabled to embody a multi-package in a form of 3-dimensional shape with a step-like groove divided into a step part and a bottom part on which the semiconductor chip or semiconductor package is mounted using polymer material containing a conductive filler.

The metal wire is formed via a plating process using the conductive filler as a seed layer so that one end and the other end thereof are disposed in the step part and the bottom part, respectively.

Therefore, when using the 3-dimensional substrate in which the semiconductor chip or the semiconductor package is mounted on the step part and the bottom part, it is possible to embody the multi-package without additional means for use in electrical connection between the semiconductor chips or the semiconductor packages.

Further, it is possible to embody the multi-package of high capacity by mounting multi-packages of the same structure on the multi-package in which the semiconductor chips or the semiconductor packages are mounted on the substrate according to the present invention.

Hereinafter, the substrate according to an embodiment of the present invention will be specifically described referring to FIGS. 1A and 1B.

Figure 1A:
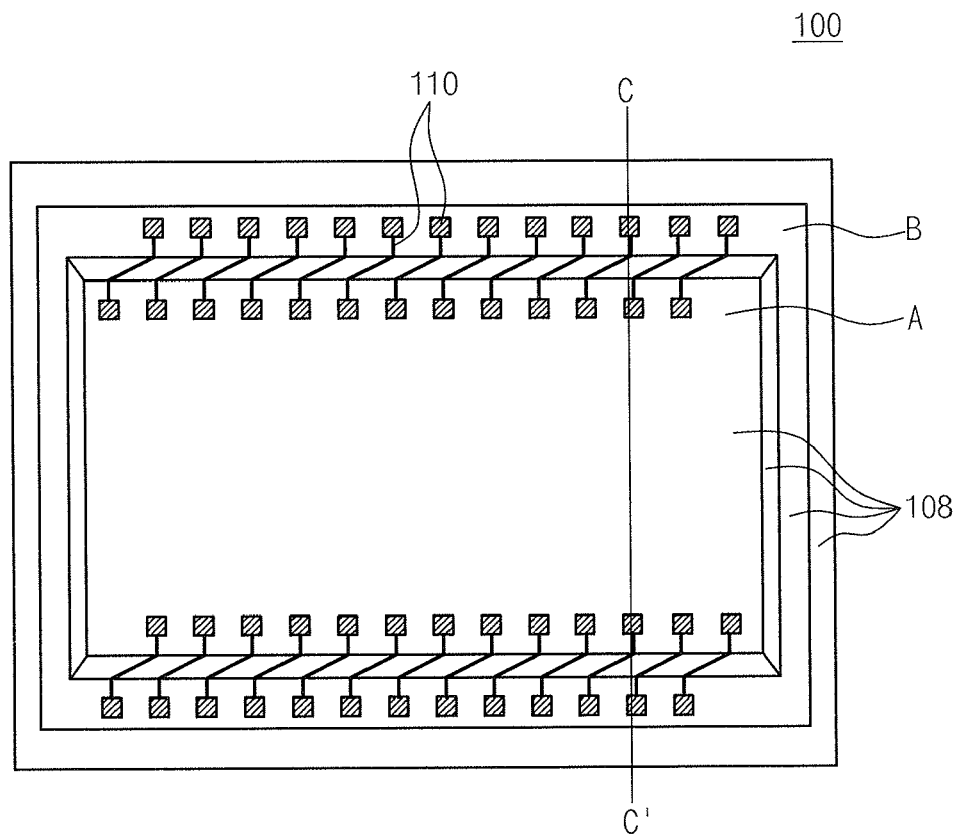
FIGS. 1A and 1B are a plane view and a cross-sectional view illustrating the substrate according to an embodiment of the present invention, respectively.
Figure 1B:
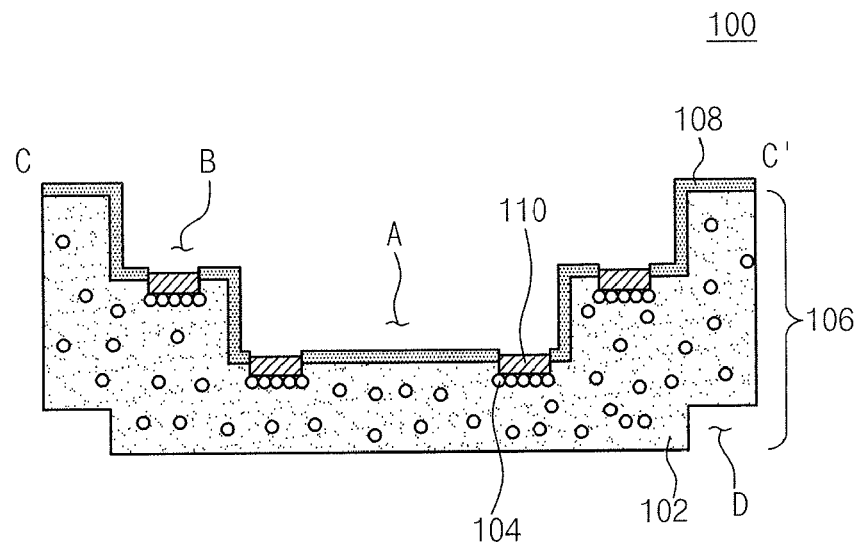

FIG. 1A shows a plane view of the substrate according to an embodiment of the present invention and FIG. 1B shows a cross-sectional view taken along C-C' of FIG. 1A.

The substrate 100 according to an embodiment of the present invention includes an underlying layer 106, a coating layer 108, and a metal wire 110. The underlying later 106 is formed so that a conductive filler 104 is contained in the polymer material 102 containing glass fiber (not shown). A solder resist is applied and patterned to the top surface of the underlying layer 106 so that the coating layer 108 causes the conductive filer 104 in one portion of the underlying layer 106 to be exposed to outside. Further, the metal wire 110 is formed via a plating process using the exposed conductive filler 104 in the underlying layer 106 as a seed layer.

More specifically, the underlying layer 106 is shaped like a 3-dimensional rectangular box with a step-like groove divided into step part B and bottom part A on which the semiconductor chip or the semiconductor package is mounted. The underlying layer 106 is formed via a process such as a press process, pultrusion process, Sheet Molding Compound process or injection molding process in a state where the conductive filler 104 is contained in the polymer material 102 containing glass fiber (not shown).

Polypropylene, epoxy or polyethylene is used as the polymer material 102 in the underlying layer 106. As the conductive filler 104 of the underlying layer, Ni, Cu, Au, Ag or Al may be used, having a diameter of 1~10 μm, or polymer material having a diameter of 1~10 μm of which the surface is plated with metal materials such as Ni, Cu, Au, Ag or Al. The conductive filler 104 in the underlying layer 106 has a volume rate of 5~30% to the total volume of the underlying layer 106.

The underlying layer 106 forms the metal wire (not shown) on the lower edge D, so that it may be electrically connected to the outside by mounting a mounting member containing a solder ball (not shown) on the external substrate.

Meanwhile, the coating layer 108 on the underlying layer 106 is formed so that the conductive filler 104 in the metal-wire forming area is exposed to define the metal-wire forming area on the step part B and the bottom part A of the step-like groove.

As well, the metal wire 110 is formed in the step part B and the bottom part A of the underlying layer 106 on which the semiconductor chip or the semiconductor package is mounted. The metal wire is formed so that one end and the other end thereof are disposed in the step part and the bottom part, respectively.

The metal wire 110 is formed via an electroless plating process using the conductive filler 104 of the underlying layer 106 exposed by patterning the coating layer 108 as the seed layer. The metal wire 110 is made from Cu or Au and the metal wire has a height less than or equal to that of the coating layer 108.

Hereinafter, the method of fabricating the substrate according to an embodiment of the present invention will be specifically explained referring to FIGS. 2A through 2C.

Figure 2A:
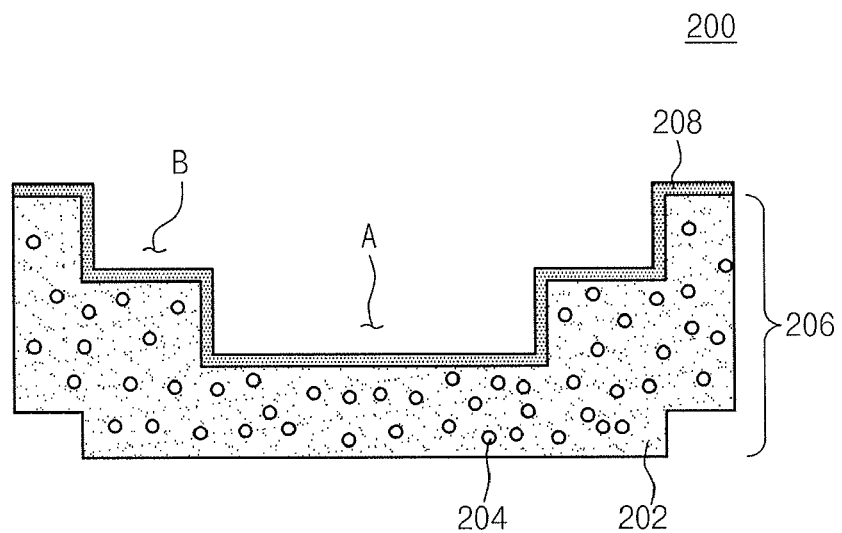
FIGS. 2A, 2B, and 2C are cross-sectional views for explaining a method of fabricating a substrate according to an embodiment of the present invention.

Referring to FIG. 2A, the conductive filler 204 is contained in the polymer material 202 which contains glass fiber (not shown) and is any one of polypropylene, epoxy or polyethylene.

The 3-dimensional underlying layer 206 with the step-like groove divided into the step part B and the bottom part A is formed via a process such as an injection molding process, a pultrusion process or a sheet molding Compound process.

Here, the conductive filler 204 is contained at the volume rate of 5~30% to the total volume of the underlying layer. The conductive filler is used with metal material such as Ni, Cu, Au, Ag or Al having a width of 1~10 μm or polymer material having width of 1~10 μm of which the surface is plated with metal materials such as Ni, Cu, Au, Ag or Al.

The coating layer 208 is formed by applying the solder resist to the top surface of the underlying layer 206 by means of a spray process.

Figure 2B:
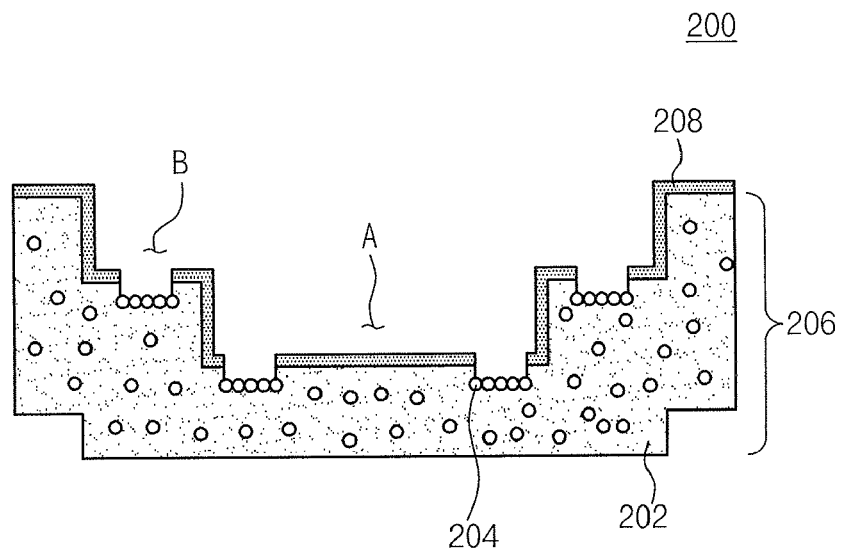

Referring to FIG. 2B, the conductive filler 204 in the metal-wire forming area on the step part B and the bottom part A is exposed by patterning the coating layer 208. At this time, the metal-wire forming area is defined so that one end and the other end thereof may be disposed in the step part B and the bottom part A respectively.

Here, the patterning proceeds via an optical method for melting the metal-wire forming area using a laser or a thermal method for melting the coating layer 208 by contacting a thermal wire of same type as the metal-wire forming area to the coating layer 208.

Figure 2C:
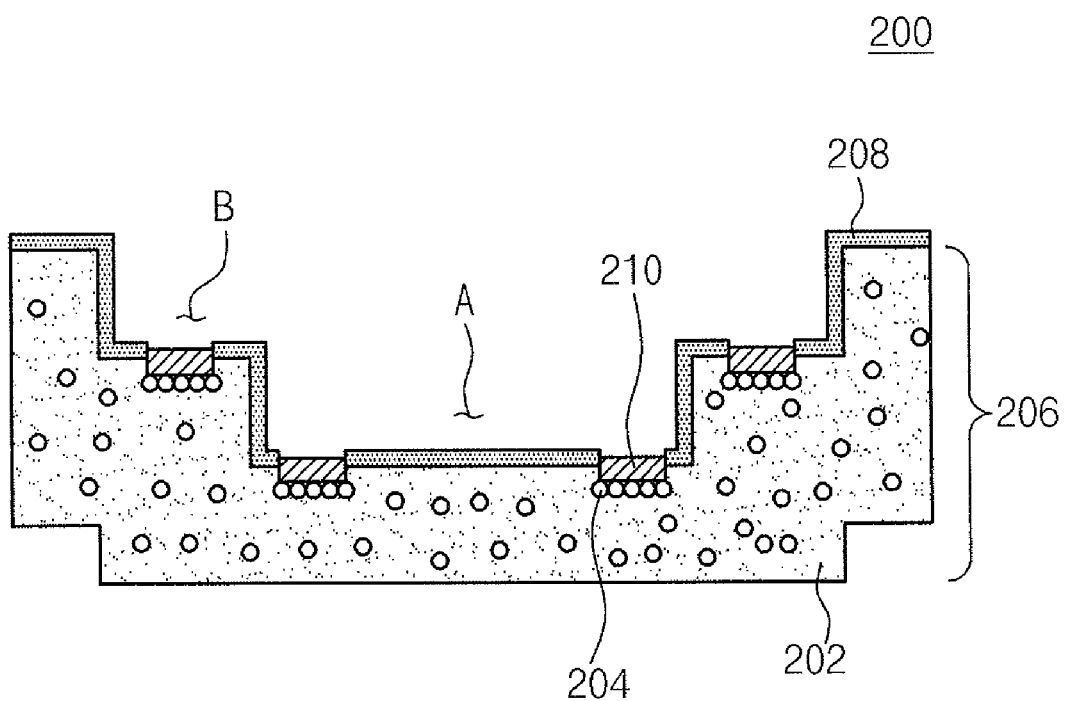

Referring to FIG. 2C, the underlying layer 206 with the patterned coating layer 208 formed thereon is dipped within the electroless plating solution in a temperature range of 80~85° C. for 5 minutes. Therefore, the conductive filler 204 in the underlying layer 206 are chemically reacted with and Cu or Au ion within the electroless plating solution, thereby forming the metal wire 210.

At this time, the metal wire 210 is formed with a height less than or equal to that of the coating layer 208. The time to dip the underlying layer 206 within the electroless plating solution for forming the metal wire 210 is inversely proportional to the density of Cu or Au ion contained within the electroless plating solution.

After taking the underlying layer 206 formed with the metal wire 210 out of the electroless plating solution, fabrication of the 3-dimensional substrate 200 is completed by a cleaning process.

As mentioned above, it is possible to embody the multi-package conveniently without additional electric connecting elements such as wire bonding, solder balls, and conductive pins by providing the 3-dimensional substrate with metal wire formed in the underlying layer containing the conductive filler.

Further, it is possible to implement the multi-package of high capacity by mounting multi-packages of the same structure on the multi-package in which the semiconductor chip or package is mounted on the substrate.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A substrate for embodying a multi-package comprising:
   an underlying layer having a polymer material containing a conductive filler, wherein the underlying layer comprises:
   a bottom part recessed from an upper surface of the underlying layer; and
   a step part stepping up from the bottom part for a predetermined height, and recessed from the upper surface of the underlying layer, wherein one or more metal-wire forming areas are located at predetermined positions in each of the bottom and step parts;
   a coating layer formed over the underlying layer including the bottom part and the step part, but excluding the metal-wire forming areas in the step part and the bottom part such that the conductive filler in the metal-wire forming area in the bottom part or the step part is exposed; and
   a metal wire formed via a plating process using the exposed conductive filler as a seed layer in the metal-wire forming area defined by the coating layer.

2. The substrate of claim 1, wherein the conductive filler is a metal material having a diameter of 1~10 μm 3. The substrate of claim 2, wherein the metal material is one selected from a group consisting essentially of Ni, Cu, Au, Ag and Al.

4. The substrate of claim 1, wherein the conductive filler comprises polymer material having a diameter of 1~10 μm of which the surface is plated with a metal material.

5. The substrate of claim 4, wherein the metal material is one selected from the group consisting essentially of Ni, Cu, Au, Ag and Al.

6. The substrate of claim 1, wherein the conductive filler has a volume rate of 5~30% to the total volume of the underlying layer.

7. The substrate of claim 1, wherein the polymer material is one selected from the group consisting essentially of polypropylene, epoxy and polyethylene.

8. The substrate of claim 1, wherein the metal wire comprises Cu or Au.

9. The substrate of claim 1, wherein the metal wire has a height less than that of the coating layer.

10. The substrate of claim 1, wherein the coating layer comprises a solder resist.

11. The substrate of claim 1, wherein the step-like groove has at least one step part.

12. The substrate of claim 1, wherein the metal wire is formed so that one end and the other end thereof are disposed on the step part and the bottom part respectively.

13. A method of fabricating a substrate for embodying a multi-package comprising:
    forming an underlying layer having a polymer material containing a conductive filler, wherein the underlying layer comprises:
    a bottom part recessed from an upper surface of the underlying laver; and
    a step part stepping up from the bottom part for a predetermined height, and recessed from the upper surface of the underlying layer, wherein one or more metal-wire forming areas are located at predetermined positions in each of the bottom and step parts;
    forming a coating layer over the underlying layer;
    exposing the conductive filler in the metal-wire forming area by patterning the coating layer; and
    forming a metal wire in the metal-wire forming area via a plating process using the exposed conductive filler as a seed layer.

14. The method of claim 13, wherein the conductive filler is used with a metal material having a diameter of 1~10 μm or polymer material having a diameter of 1~10 μm of which the surface is plated with the metal material.

15. The method of claim 14, wherein the metal material is one selected from the group consisting essentially of Ni, Cu, Au. Ag and Al.

16. The method of claim 13, wherein the conductive filler is contained at a volume rate of 5~30% to the total volume of the underlying layer.

17. The method of claim 13, wherein the polymer material is used with one selected from the group consisting essentially of polypropylene, epoxy and polyethylene.

18. The method of claim 13, wherein the underlying layer is formed via one method selected from the group consisting essentially of a press process, a pultrusion process, a sheet molding compound process and an injection molding process.

19. The method of claim 13, wherein the coating layer is formed by a solder resist.

20. The method of claim 13, wherein the coating layer is patterned via an optical method using a laser or a thermal method using thermal wire.

21. The method of claim 13, wherein the metal wire has a height less than that of the coating layer.

22. The method of claim 13, wherein the metal wire is formed via an electroless plating process using an electroless plating solution in a temperature range of 80~85° C. containing Cu or Au.

23. The method of claim 22, wherein the time consumed in the electroless plating process is inversely proportional to the density of Cu or Au contained in the electroless plating solution.

24. The method of claim 13, further comprising cleaning the underlying layer formed with the metal wire after forming the metal wire.

25. The method of claim 13, wherein the metal wire is formed so that one end and the other end thereof are disposed on the step part and the bottom part respectively.

* * * * *